United States Patent
Kanatake

[19]

[11] Patent Number: 6,130,742

[45] Date of Patent: Oct. 10, 2000

[54] EXPOSURE APPARATUS FOR A BALL SHAPED SUBSTRATE

[75] Inventor: Takashi Kanatake, Chiba, Japan

[73] Assignee: Ball Semiconductor, Ltd., Nagareyama, Japan

[21] Appl. No.: 09/173,734

[22] Filed: Oct. 16, 1998

[30] Foreign Application Priority Data

Oct. 17, 1997 [JP] Japan ..................................... 9-303738
Oct. 23, 1997 [JP] Japan ..................................... 9-309274

[51] Int. Cl.[7] .......................... G03B 27/58; G03B 27/48; G03B 27/52
[52] U.S. Cl. .................. 355/47; 355/48; 355/49; 355/43
[58] Field of Search .................... 355/47, 48, 49, 355/53, 72, 45, 23, 46, 50, 97, 117, 53.1, 53.3, 53.4, 67, 75, 77, 73, 133, 132, 43, 120; 430/395

[56] References Cited

U.S. PATENT DOCUMENTS

| | | |
|---|---|---|
| 3,582,176 | 6/1971 | Mathisen ................................ 359/33 |
| 3,998,659 | 12/1976 | Wakefield ............................... 136/250 |
| 4,087,177 | 5/1978 | Gumm et al. ............................ 355/47 |
| 4,225,375 | 9/1980 | Aidlin et al. ........................... 156/242 |
| 5,461,455 | 10/1995 | Coteus et al. ............................ 355/43 |
| 5,686,230 | 11/1997 | Nellissen ................................ 430/395 |
| 5,870,177 | 2/1999 | Yoshikawa .............................. 355/72 |
| 5,877,943 | 3/1999 | Ramamurthi ............................ 361/783 |

Primary Examiner—Eddie C. Lee
Assistant Examiner—Rodney Fuller
Attorney, Agent, or Firm—Edward J. Kondracki; Miles & Stockbridge P.C.

[57] ABSTRACT

An exposure apparatus for a ball shaped substrate for manufacturing semiconductor devices. An exposure apparatus continually exposes light through a mask having a specified pattern to a surface of a ball shaped substrate. Holders each holding a ball shaped substrate are attached to an annular member that rotates continuously. Optics equipment guide the light from a light source to a surface of the substrate through a mask having a specified pattern. At the same time, optics equipment scans the light emission end to maintain the location relationship of the substrate with the annular member. The substrate is exposed while moving continuously.

19 Claims, 10 Drawing Sheets

$l = 0.5\text{m}, v_b = 250\text{m/s}, t = 10\mu\text{sec}.$ $l = 0.3\text{m}, v_b = 250\text{m/s}, t = 10\mu\text{sec}.$ $l$ = 0.5m, $v_b$ = 150m/s, $t$ = 10μsec.

EXPOSURE APPARATUS FOR A BALL SHAPED SUBSTRATE

BACKGROUND OF THE INVENTION

1. Field of the Invention

Present invention is related to an exposure apparatus for a ball shaped substrate for manufacturing semiconductor devices. More specifically, the present invention is related to a new apparatus which irradiates slight to continuously supplied substrates, each having a ball shape.

At the same time, the present invention is related to a holder for the ball shaped substrate. More specifically, this holder holds and participates in minute positioning of the small ball shaped substrate.

2. Description of Related Art

Generally, semiconductor devices are formed on a flat substrate like a silicon wafer, however recently, the use of a ball shaped semiconductor as a substrate has been suggested.

A ball shaped semiconductor is made to solidify under stress-free conditions. As a result, a ball shaped semiconductor has a substantially complete ball shape. However, the ball shaped semiconductor has the same composition as general semiconductor wafer. Accordingly, a ball shaped semiconductor can be used as a substrate of semiconductor devices.

Compared with an ordinarily flat substrate having the same surface area, the ball shaped substrate has smaller mass according to the geometric character of the ball shape and this character becomes advantageous in proportion to size. Accordingly, the substrate material can be minimized because of use of the ball shaped substrate.

Because the ball shaped substrate is initially a chip shape, no dividing process is necessary. At the same time, the ball shaped substrate can be completely covered with a pasivation film for the same reason and be implemented with raise of wages chip condition without any package. Then, dividing process and packaging process can be omitted.

Furthermore, because of use of the ball shaped substrate, packaging density is improved and a three dimensional arrangement can be formed. By such reasons, the ball shaped substrate is expected to be an important material in the field of semiconductor devices.

Generally, a semiconductor device is formed on the surface of a semiconductor wafer that is a slice of a single crystal semiconductor material. Ordinarily, many semiconductor devices are prepared on one semiconductor wafer and the wafer is cut and divided to many chips.

The so-called photolithography technique is utilized generally in the manufacturing process of a semiconductor device. In this technique, resist material is put on a wafer, and the resist material is exposed by light through a mask. Then, the resist material is changed by the light according to a pattern of the mask and becomes a so-called resist mask. Such a resist mask is utilized for depositing and etching to form devices.

The process of manufacturing of current semiconductor devices, a so-called stepper is used. A steeper comprises an optical apparatus which moves horizontally and exposes a surface of one substrate wafer many times. On the contrary, the ball shaped substrate is irradiated only once. Therefor, a stepper cannot be used as an exposure apparatus for a ball shaped substrate. In addition, a ball shaped substrate must be precisely located while exposed. However, there is no apparatus that handles a ball shaped substrate.

The term "substrate" means "ball shaped substrate" in following description.

SUMMARY OF THE INVENTION

The exposure apparatus according to the present invention continually exposes light through a mask having specified pattern to a surface of a ball type substrate. This apparatus comprises an annular member, holders, a feeder, a collector, a light source and an optics equipment.

The holders each holding a ball shaped substrate are attached on the annular member and the annular member rotates continuously. The optics equipment guides the light from the light source to the surface of the substrate through a mask having a specified pattern. At the same time, the optics equipment scans its light emission end and maintains the location relationship with the annular member. Then the substrate is exposed while moving continuously.

According to an embodiment of the present invention, the optics equipment comprises a spheroid mirror. The light source is a radial light source located on one focal point of the spheroid mirror and the substrate passes across the other focal point of the spheroid mirror. Then, the light is exposed to the whole surface of the substrate.

At the same time, the present invention provides a holder which holds a ball shaped substrate. This holder comprises at least an upper member and a lower member. The upper member holds a ball shaped substrate and can be moved against the lower member. Accordingly, there is no rubbing between the substrate and the holder while the substrate rotates and/or moves.

The above and other objects, features and advantage of the present invention will be apparent from the following description of preferred embodiments of the present invention with reference to the accompanying drawings.

DETAILED EXPLANATION OF THE INVENTION

Figure 1:
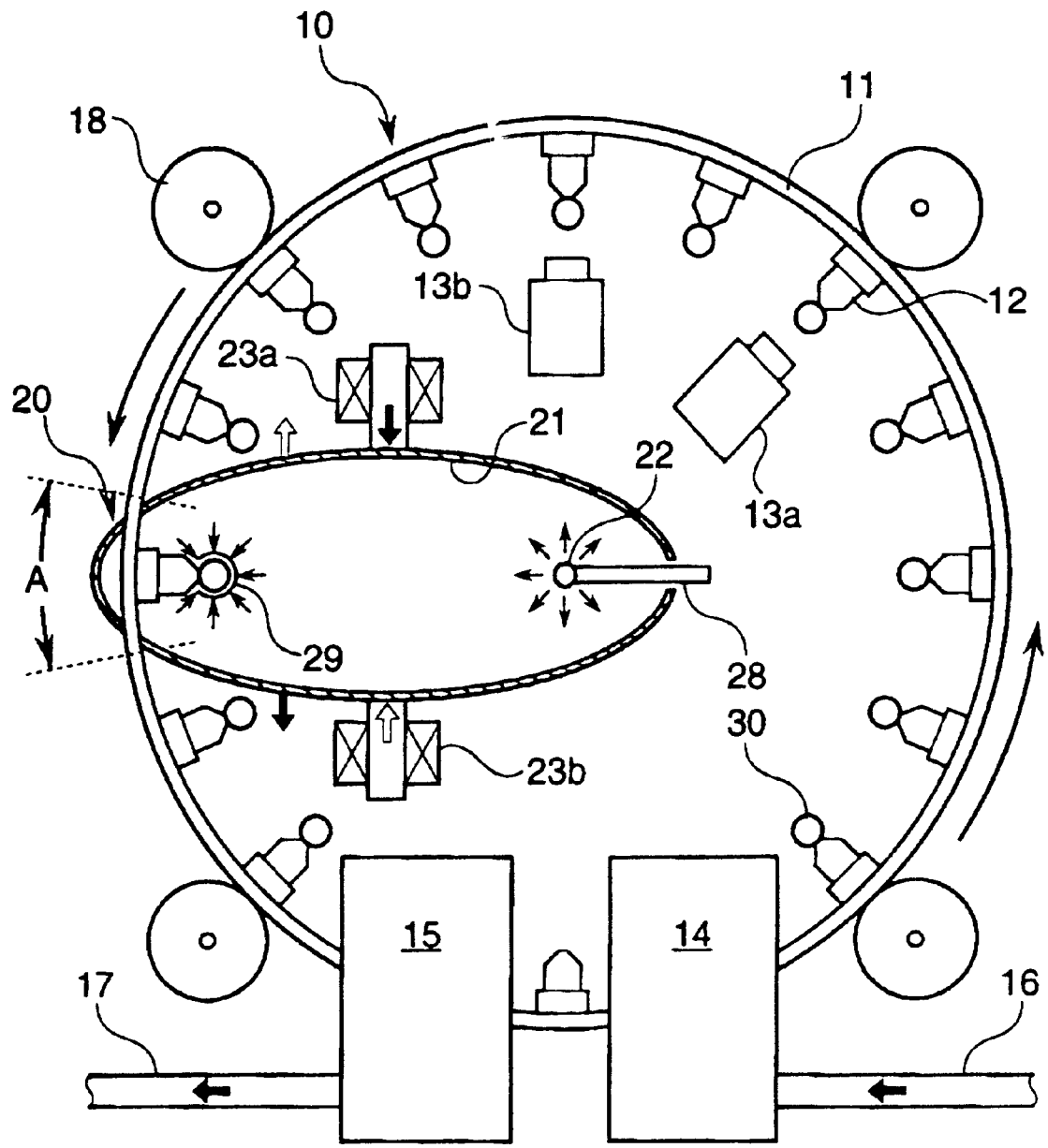
FIG. 1 is a sectional view which shows one of concrete constructions of the present invention.

As shown in FIG. 1, this apparatus consists mainly of a transportation means 10 and an optics equipment 20.

The transportation means 10 presents substrate 30 successively to the optics equipment 20 and the optics equipment 20 irradiates light on each substrate 30.

The transportation means 10 comprises an annular member 11, a plurality of spaced holders 12, sensors 13a, 13b, feeder 14 and collector 15. The annular member 11 is supported from outside by several guide rollers 18 and rotates continuously. The holders 12 are arranged inside of the annular member 11. The sensors 13a, 13b detect the substrate 30 from the inside of the annular member 11. The feeder 14 supplies substrates 30 one by one to each holder 12, and the collector 15 collects substrates 30 from the holder 12. Each substrate 30 is exposed in the optics equipment while held on the holders 12.

Substrates 30 is continuously supplied to the feeder 14 through a conduit 16 and continuously carried out from the collector 15 through a conduit 17. In the conduit 16, 17, substrate 30 is conveyed by fluid, for example air, inert gas or conductivity water. Accordingly, before exposure, substrates are successively supplied to each holder 12.

Each substrate moves according to the rotation of the annular member 11 and is exposed while passing a certain section on the annular member 11.

Figure 2:
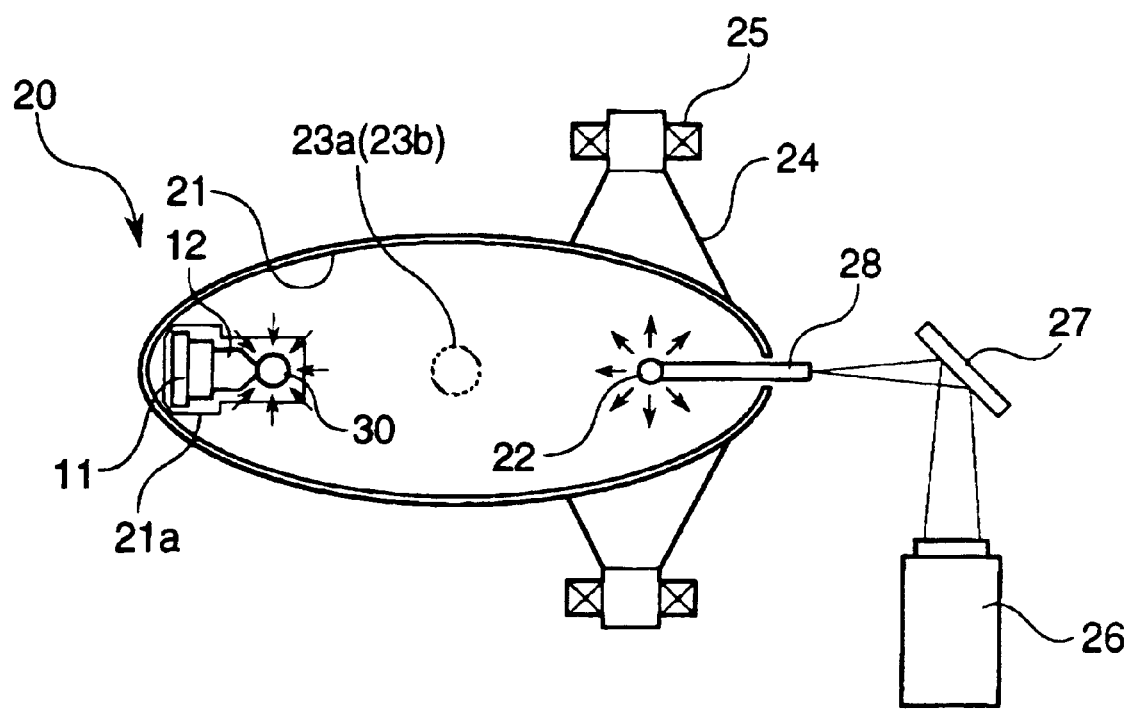
FIG. 2 is a sectional view of an optical equipment of the apparatus shown in FIG. 1.

The optics equipment 20 includes a spheroid mirror 21, light source 22, actuators 23a, 23b and mask 29. As shown in FIG. 2, the spheroid mirror 21 is supported by brackets 24 and brackets 24 are suspended by bearings 25. The rotation axis of the bearing 25 passes through the first focal point of the spheroid mirror 21. At the same time, the axis of the spheroid mirror 21 is common with the axis of the rotation of the annular member 11. A pair of actuators 23a, 23b work in turn and are arranged with the top and bottom of the spheroid mirror 21 so that the spheroid mirror 21 rotates around its first focal point.

The light source 22 can be a cylindrical Optical Guide (C.O.G.) made up of a laser equipment 26, an optical 28 and a reflecting mirror 27. The emitting end of the C.O.G. is located on the first focal point of the spheroid mirror 21. Accordingly, in the spheroid mirror 21, the laser light is always emitted from the first focal point and collected at the second focal point of the spheroid mirror 21. As mentioned below, the substrate 30 held on the holder 12 passes through the second focal point of the spheroid mirror 21. The mast 29 is fixed in the inside of the spheroid mirror 21 and is displaced with the spheroid mirror 21 arranged as surrounding the substrate 30.

As shown in FIG. 2, an aperture 21a is formed in the side of the spheroid mirror 21. The annular member 11, substrate holder 12 and substrate 30 pass through the aperture 21a. Another aperture is formed at the end of the spheroid mirror 21 so that the optical fiber 28 that transmits the laser light passes through.

Of course, the laser light is not reflected where the openings exist, but there is no problem because the area of the apertures is very small in comparison with the total area. For example, the diameter of circular annular member 11 (it is the same as the length of the spheroid mirror 21.) is more than 1 m as against the diameter of the substrate 30 is less than 1 mm.

The operation of the exposure apparatus will be described next. At first, the substrate 30 is supplied to the feeder 14 through the conduit 16 and the feeder 14 puts the substrate 30 on the holder 12 one by one. Because the annular member 11 is rotating continuously, each substrate 30 is attache do the holder 12 by centrifugal force until the collector 15 collects it.

The substrate 30 held on the holder passes opposite the sensors 13, 13b and the sensors 13a, 13b sense whether the substrate 30 is correctly held on the holder 12. At the same time, it can be detected when each substrate 30 passes the exposure section A from passage timing of the sensors and the rotating velocity of the annular member 11. In this time, the actuator 23b is extended and the spheroid mirror 21 is located at an upper position.

Next, while the substrate 30 passes between the exposure section A, the actuator 23a operates. More particularly, when the substrate 30 is located on the second focal point of the spheroid mirror 21, the actuator 23a starts to move and the spheroid mirror 21 follows the substrate 30. After the substrate 30 passes the exposure section A, the actuator 23b works again and the spheroid mirror 21 returns to the initial position. At the same time, after exposure the substrate proceeds to the collector 15. The substrate 30 collected by the collector 15 is transmitted to another process through the conduit 17. Such serial actuation is repeated continuously.

According to another embodiment, several optical assemblies can be attached to one annular member. It is a required condition of an apparatus equipped with a spheroid mirror and fixed light source that the location of the substrate coincides with the second focal point of the spheroid mirror. However, when a light source is displaced with the spheroid mirror, a smaller spheroid mirror can be used.

Furthermore, use of the spheroid mirror is not essential. When more simple optics equipment is used, one-half of the substrate can be still exposed as shown in FIG. 3.

Figure 3:
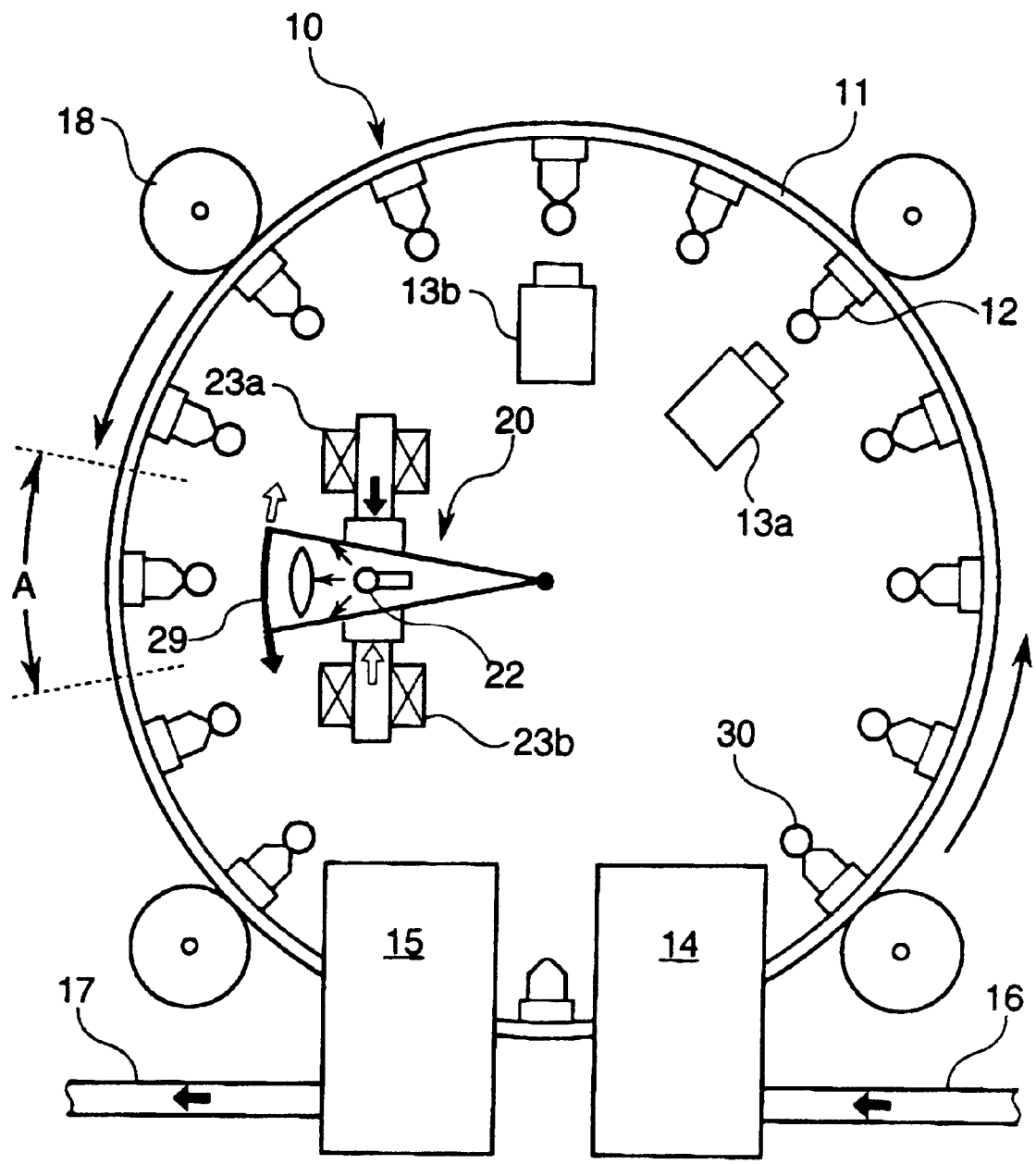
FIG. 3 is a sectional view which shows another construction of the present invention.

The fundamental construction of the apparatus shown in FIG. 3 resembles the one shown in FIG. 1. However, in this embodiment, the construction of the optics equipment 20 is changed and only one side of the substrate 30 is exposed.

This apparatus comprises an emission light source 22 and a flat, tubular shaped mask 29. Actuator 23a, 23b operate only the mask 29. Because the weight of the working component (only the mask 29) is small, the actuator 23a, 23b can be simplified. However, the mask 29 is a plane, while the substrate 30 has spherical surface. Accordingly, the pattern of the mask must be formed so that the required pattern is formed on the surface of the substrate. At the same time, it is preferable that an optics equipment causing convergence of light is attached between mask 29 and the substrate 30.

Figure 4:
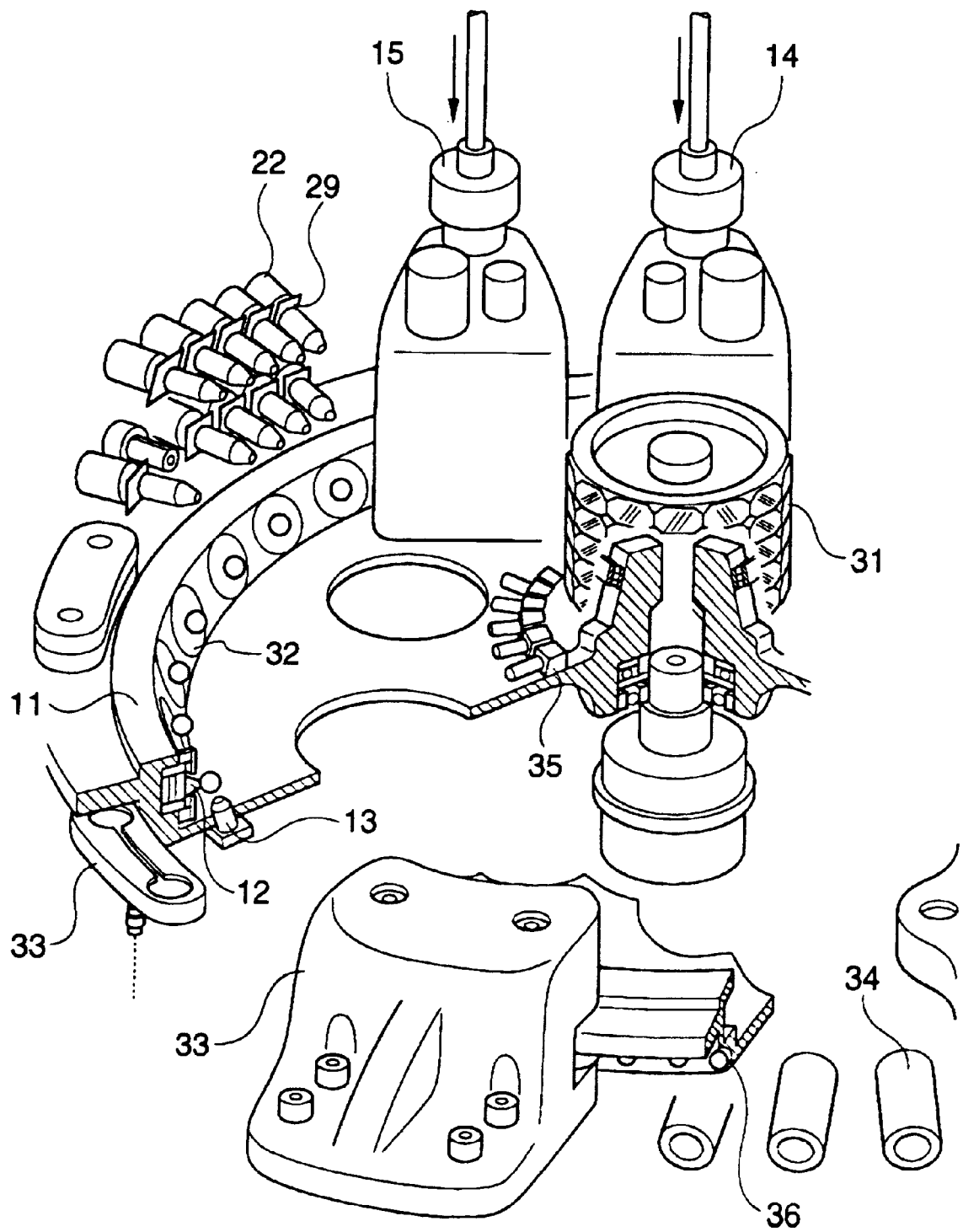
FIG. 4 is an illustration showing another construction of the present invention furthermore.

FIG. 4 shows another embodiment of the present invention in which the apparatus comprises a horizontal annular member 11 and a polygon mirror 31. The annular member 11 rotates around a vertical axial and the polygon mirror 31 rotates around the same axis as the annular member 11. Several holders 12 are attached inside the annular member 11 at equally spaced locations.

At the circumference of each holder 12, concavities each having a spherical inner surface are formed. Each inner surface of the concavities works as a reflecting mirror 32.

The annular member 11 is supported in a non contact manner by several air 33 and several permanent magnets 36 attached in contour.

Several actuators 34 are arranged along the circumference of the annular member 11 and the annular member 11 rotates by mutual action of the permanent magnet 36 and the actuator 34. An image sensor 13 is mounted on the inside of the annular member and senses the substrate 30 held on the holder 12.

Several light sources 22, several masks 29 and a polygon mirror 31 comprise an optics equipment. Each mask 29 arranged outside the annular member 11 is attached to a respective light source 22.

Each mask 29 has a particular characteristic pattern, and a complete pattern for one substrate is completed when all masks are put together. The polygon mirror 31 is provided with several plane refracting surfaces and is turned by an actuator 35 around the same axis of rotation as the annular member 11. The light emitted from the light source 22 arrives at the polygon mirror 31 through the respective mask 29. The polygon mirror 31 rotates in constant velocity causing the catoptric light to be scanned in a constant field. Accordingly, the light follows the substrate 30 on the annular member 11 in the constant field.

For good exposure with the apparatus mentioned above, the control should be done as follows. At first, the rotation of the annular member 11 and the rotation of the polygon mirror 31 should be synchronized based on a certain relationship. Next, it is desirable to limit the divergence of the light on the surface of the substrate to 1 mm.

According to a preferred embodiment of the present invention, the angular velocity $\omega_m$ of the annular member 11 and the angular velocity of the polygon mirror 31 is applied to formula 1 shown below.

$$\omega_b = 2\omega_m (L-R)/L \qquad \text{[formula 1]}$$

In the formula 1, "L" is a radius of gyration of the substrate held on the annular member and "R" is the radius of the polygon mirror.

Figure 5:
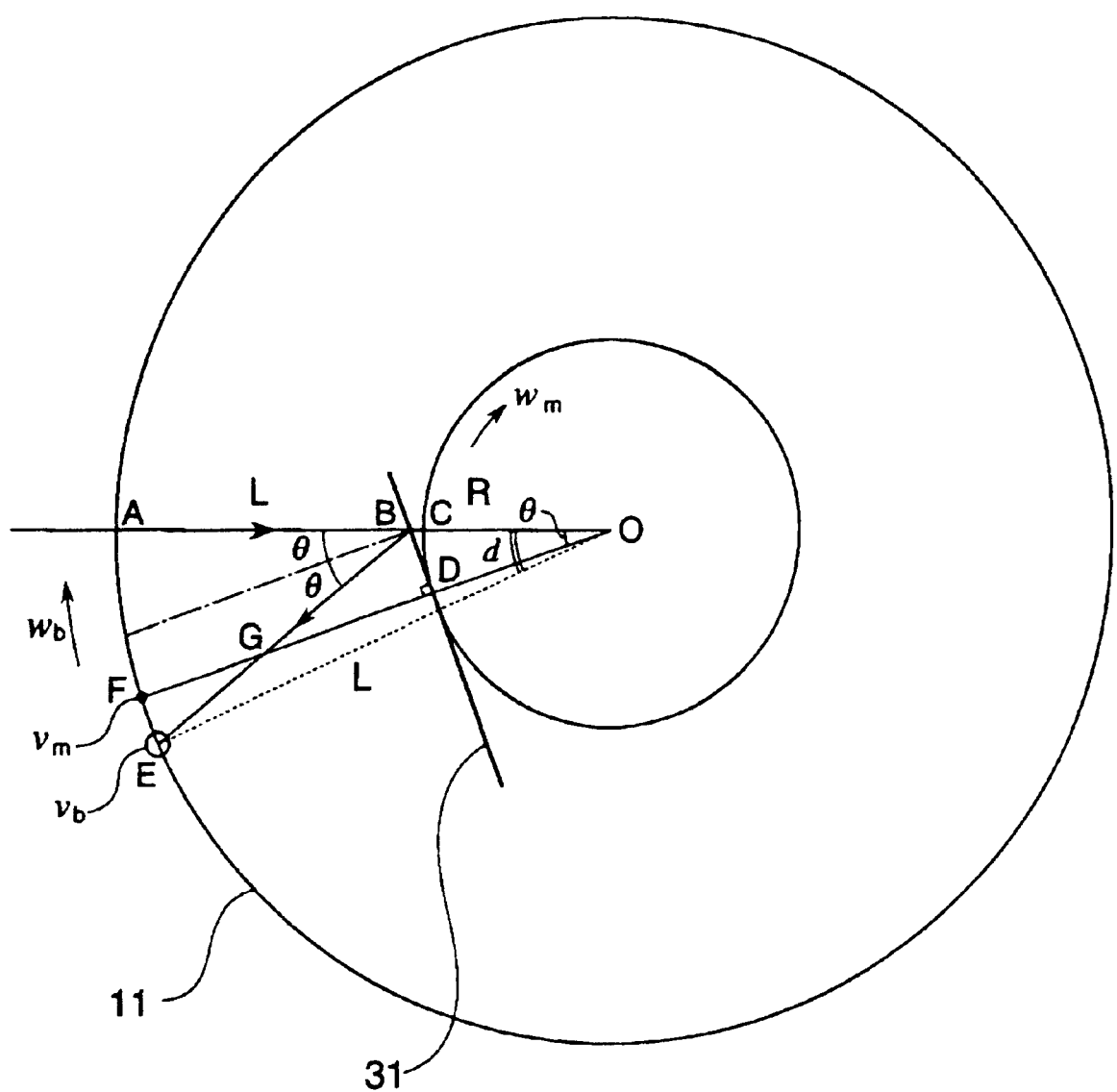
FIG. 5 is a geometric disposition of the apparatus shown in FIG. 4.

As shown in FIG. 5, the effective radius (L( of the annular member 11 is the radius of gyration of the substrate 30. The catoptric light of the polygon mirror 31 becomes a spot on the annular member located inside. When the quantity of migration of the spout is "α", the relationship of these parameters is shown in formula 2 as shown below.

$$\sin\alpha = (\sin(2\Theta))(L-R)/L \qquad \text{[formula 2]}$$

In the formula 2, "θ" means the rotation quantity of the polygon mirror 31.

The required conditions include synchronized movement of the substrate and the spot while the annular member 11 and the polygon mirror 31 rotate with a constant angular velocity $\omega_b$, $\omega_m$ is shown in formula 3 as below.

$$\omega_b = \frac{\{2\omega_m \cos(2\theta)(L-R)\}/L}{[\{L-(L-R)^2 \sin^2(2\theta)\}/L^2]^{1/2}} \qquad \text{[formula 3]}$$

When an initial condition "θ=0" is applied to the formula 3, formula 1 can be obtained.

Then, other conditions to formula 1 are set and a deviation of the exposed light spot on the surface of the substrate at 10 is measured E seconds after the initial state. Each condition of the measurement is shown in Table 1 and the result of the measurement is shown in FIGS. 6, 7 and 8, as shown in the following table.

TABLE

Figure 6:
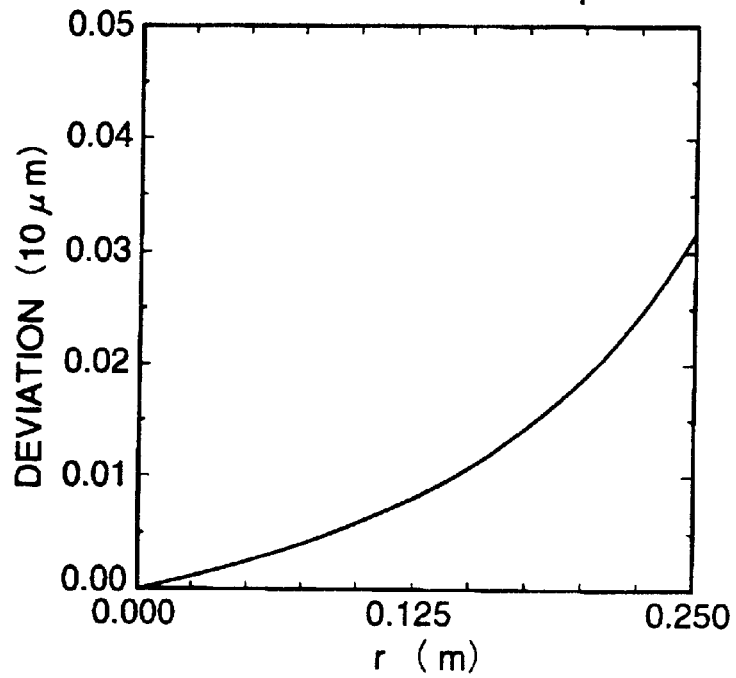
FIG. 6, FIG. 7 and FIG. 8 are graphs showing optical characteristics of the apparatus shown in FIG. 4.
Figure 7:
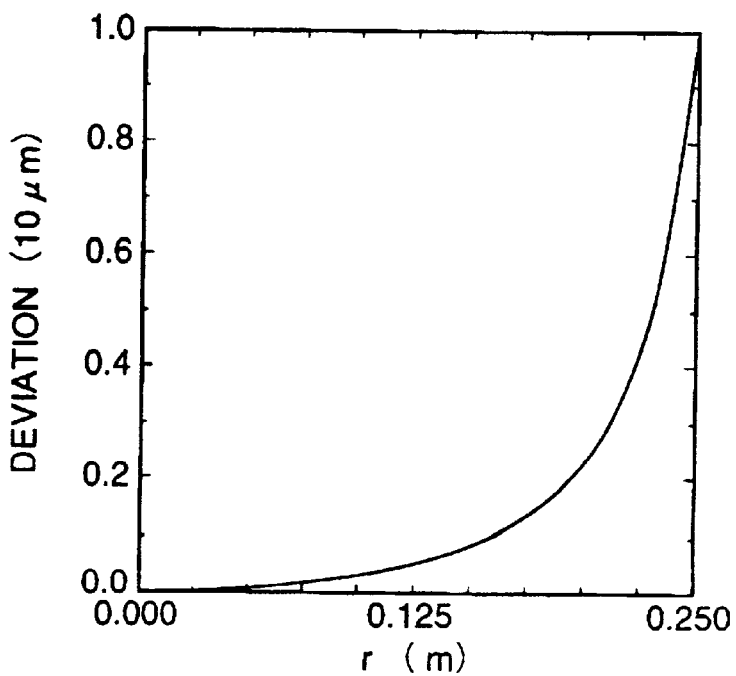
Figure 8:
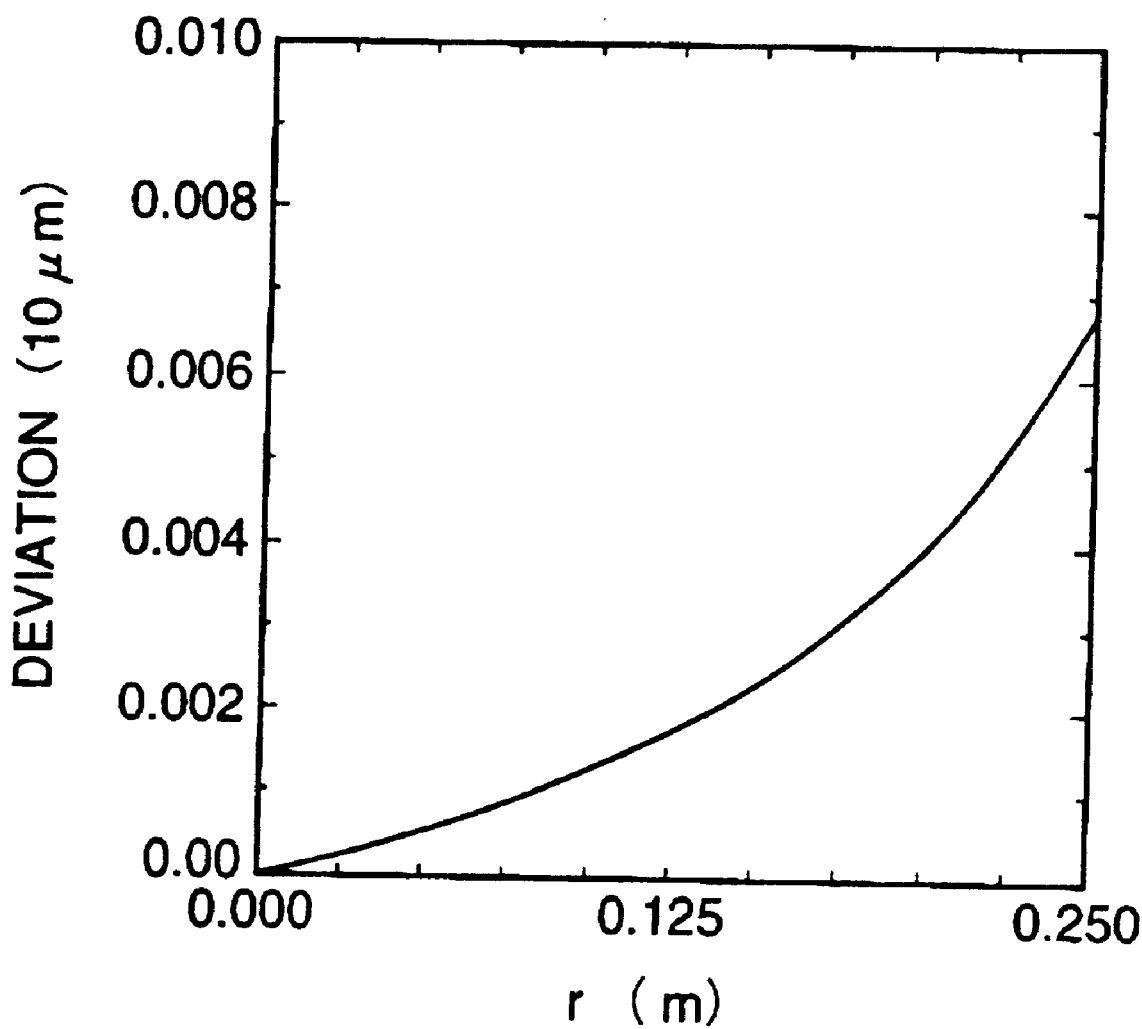

| | | | |
|---|---|---|---|
| Radius of annular member (m) | 0.5 | 0.3 | 0.5 |
| Drift speed of substrate (m/second) | 250 | 250 | 150 |
| Graph which shows measurement resultant | FIG. 6 | FIG. 7 | FIG. 8 |

For each measurement resultant shown in the table, the apparatus shown in FIG. 4 can expose the substrate with a very small deviation.

Figure 9:
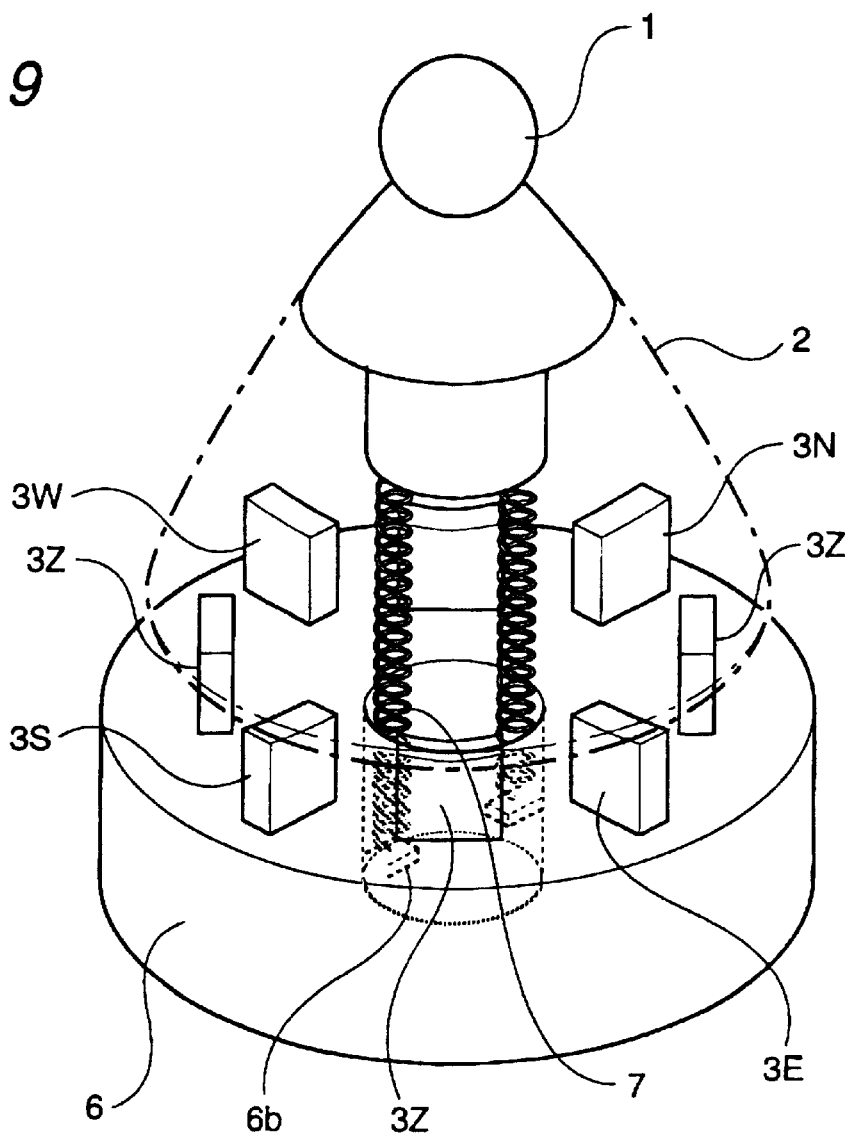
FIG. 9 is an illustration showing a concrete construction of holder of the present invention.
Figure 10:
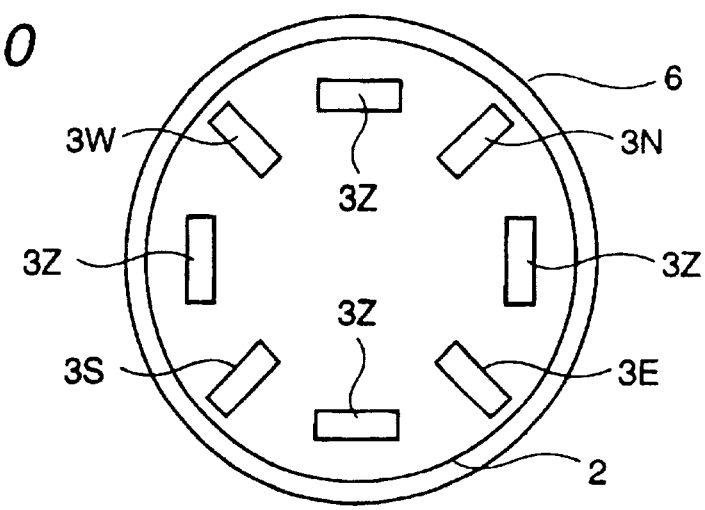
FIG. 10 is a layout view of the ultrasonic wave actuators of the holder shown in FIG. 9.
Figure 11:
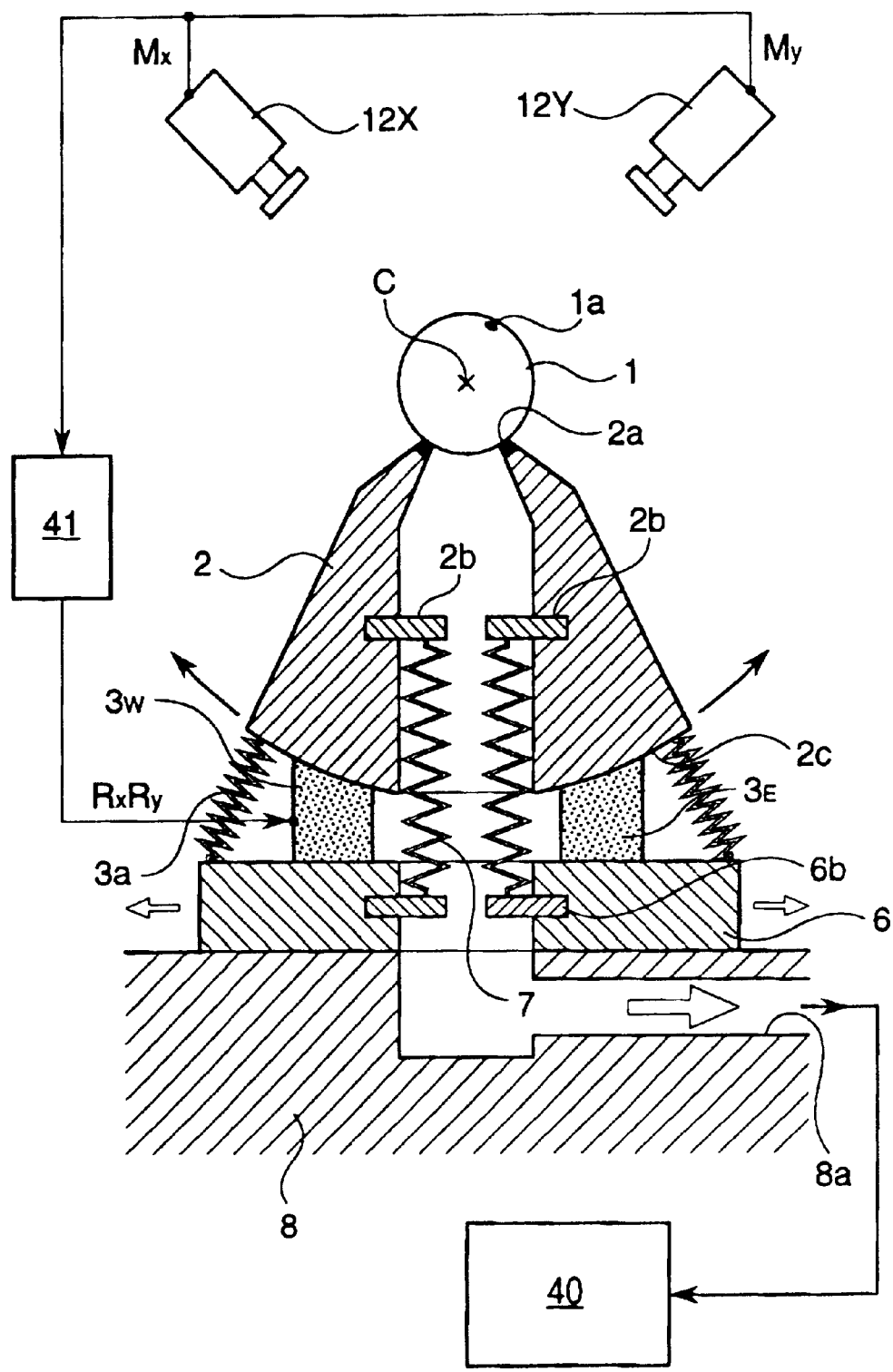
FIG. 11 is a longitudinal sectional view of the holder shown in FIG. 9.

FIGS. 9, 10 and 11 shown another embodiment of the holder for holding a ball shaped substrate on the annular member.

This holder comprises an upper support member 2, ultrasonic wave actuators 3E, 3W, 3S, 3N, 3Z and a lower support member 6 as shown in FIG. 9. The upper support member 2 supports a ball shaped substrate 1 directly at its upper end. The lower support member 6 supports upper support member 2 at the lower part of member 2 through the ultrasonic wave actuators 3E, 3W, 3S, 3N, 3Z.

The upper support member 2 and the lower support member 6 include a through-hole and are attached by a pin 2b, 6b on each inside. These pins 2b, 6b are connected mutually by spring 7. The spring 7 pulls nearer the support member 2, 6 mutually.

The upper support member 2 has a conical outer shape and a spherical shaped bottom having a center coinciding with the geometric center C of the substrate held on the holder. According to the preferred embodiment of the present invention, the upper end of the upper support member 2 is covered by a shock absorbing material 2a to assure a grip on the substrate and to prevent damage to the substrate.

The ultrasonic wave actuators 3E, 3W, 3S, 3N are arranged radially and the ultrasonic wave actuator 3Z is arranged annularly, as shown in FIG. 10.

The inside of the lower support member 6 is connected to a pressure reduction means 40. A bellows 3a that maintains an air-tight seal between the support members is arranged to maintain the internal pressure of the support members.

In the holder as explained above, a ball shaped substrate is put on the upper end of the support member 2.

The inside of the holder is decompressed while the substrate is on the upper support member, so that the substrate is affixed to the holder. In this condition, the upper support member 2 moves while the ultrasonic wave actuators 3E, 3W, 3S, 3N operates.

Because the center of the spherical surface of the upper support member 2 coincides with the center of the substrate 1 held o nit, movement of the upper support member 2 means substantially the same as the rotation of the substrate around a horizontal axis. On the other hand, when the actuator 3Z works, the substrate 1 rotates around a vertical axis.

FIG. 11 shown according to another preferred embodiment of the present invention, a dot 1a colored on the surface of the ball shaped substrate 1 at its bottom surface and is monitored by the image sensor 12 X, 12Y. The image sensor preferably is a charge coupled device (CCD) camera that optionally is used with an optics equipment which magnifies an image of the ball shape substrate. The ultrasonic wave actuator 3E, 3W, 3S, 3N, 3Z is controlled with a signal provided by the image sensor 12X, 12Y. In this way, the correction of location and posture of the substrate 1 can be automated.

Figure 12:
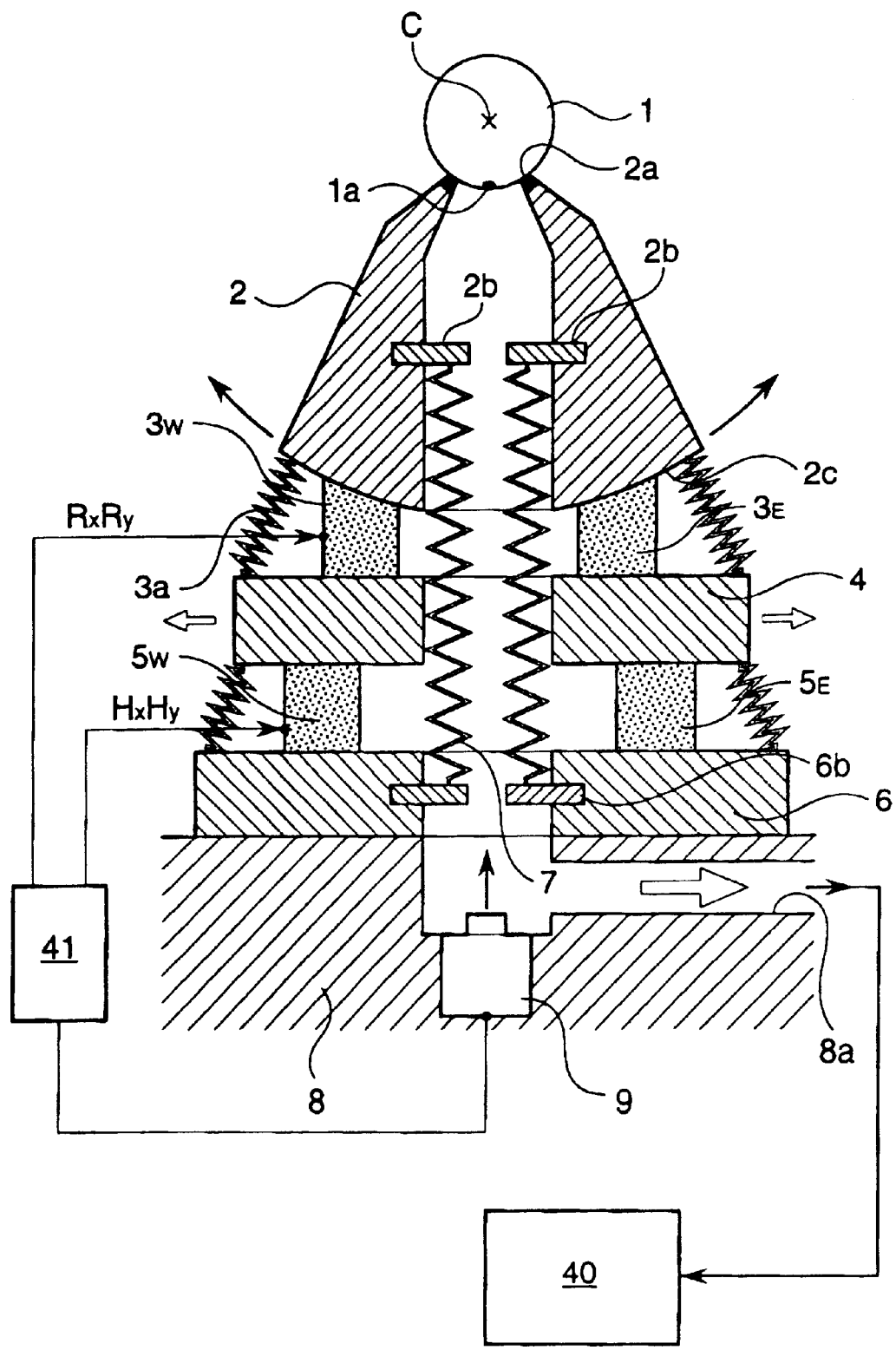
FIG. 12 is a longitudinal sectional view of another holder provided by the present invention.

FIG. 12 shows another embodiment of the holder according to the present invention. This holder comprises an intermediate support member 4 and an ultrasonic wave actuator 5 W, 5E in addition to the holder shown in FIG. 10. Namely, the ultrasonic wave actuators 3E, 3W are provided on the intermediate support member 4 and the intermediate support member 4 is supported by the ultrasonic wave actuator 5W, 5E on the lower support member. The intermediate support member 4 has a through hole to accommodate the spring 7 which is assembled with the upper support member 2 and the lower support member 6.

Furthermore, in this embodiment, an image sensor 9 is arranged on a base plate 8 inside the support members. The image sensor 9 senses the dot la inscribed on the bottom of the substrate 1 through the inside of each support member 6, 4, 2.

This holder can rotate the substrate 1 around a horizontal axis by the ultrasonic wave actuator 3W, 3E as shown in FIG. 10. And this holder can rotate the substrate 1 around a vertical axis by the ultrasonic wave actuator 3z as shown in FIG. 10. Furthermore, this holder can move the substrate 1 horizontally by the ultrasonic wave actuator 5W, 5E as shown in FIG. 12.

At the same time, in this holder, the ultrasonic wave actuators can be controlled automatically by the control circuit 41, which directs the image sensor 9 to locate the dot 1a on the right position.

What is claimed is:

1. An exposure apparatus for continually exposing a surface of a ball shaped substrate to light through a mask having a pattern comprising an annular member, a plurality of holders, a feeder, a collector, a light source and an optics equipment;

said annular member being arranged to rotate continuously, said plurality of holders being located on the annular member;

said feeder arranged to continuously supply a one of a plurality of ball shaped substrates to each of said plurality of holders;

said collector arranged to continuously collect exposed ball shaped substrates from each of said plurality of holders; and said optics equipment arranged to guide light from the light source to a surface of the ball shaped substrate in a pattern and arranged to maintain an optical location relationship with the annular member in a annular member section.

2. The exposure apparatus of claim 1, wherein said ball shaped substrates are each a silicon single crystal ball.

3. The exposure apparatus of claim 1, wherein said light source is laser light supplied through an optical filter.

4. The exposure apparatus of claim 1, wherein said plurality of holders includes a means for holding and a means for reducing pressure;

said means for holding has an annular end which has a smaller aperture than a diameter of the ball shaped substrates; and said means for reducing pressure is connected to an inside of the means for holding.

5. The exposure apparatus of claim 1, wherein said optics equipment comprises:

a spheroid mirror having a reflecting plane therein, and said ball shaped substrates held on the holders are located in a second focal point of the spheroid mirror while the spheroid mirror rotates around an axis which is common with rotation of the annular member.

6. The exposure apparatus of claim 5, wherein said axis of rotation of the spheroid mirror coincides with the first focal point of the spheroid mirror.

7. The exposure apparatus of claim 1, wherein said optics equipment comprises a fixed mask, a light source and a rotating polygon mirror, wherein an axis of rotation of the polygon mirror coincides with the axis of rotation of the annular member and the rotation of the polygon mirror is synchronized with the rotation of the annular member.

8. The exposure apparatus of claim 7, wherein the relationship between an angular velocity $\omega_m$ of an annular member and an angular velocity $\omega_b$ of the polygon mirror is defined by $\omega_b = 2\omega_m (L-R)/L$, where L is the radius of gyration of a substrate held on the annular member and R is a radius of the polygon mirror.

9. The exposure apparatus of claim 7, wherein said light source is a plurality of light sources;

said mask is a plurality of masks;

said Polygon mirror has a plurality of reflection planes; and a pattern projected to one ball shaped substrate is distributed between several masks.

10. The exposure apparatus of claim 7, wherein said annular member comprises a plurality of spherical mirrors, each said mirror being mounted on a respective holder;

each said respective holder being mounted on an inner wall of the annular member; and each said respective holder having a center that coincides with a respective ball shaped substrate.

11. A holder for holding a ball shaped substrate comprising:

a first tube-shaped member, a second tube-shaped member, and a first spring, wherein a first end of the first tube-shaped member has an inside diameter smaller than a diameter of a ball shaped substrate and an other end of the first tube-shaped member has a spherical shape having a center which coincides with a center of a ball shaped substrate held on the first end of the tube-shaped member;

the second tube-shaped member includes at least three ultrasonic wave actuators which operate individually, wherein said second tube-shaped member supports the first tube-shaped member through said ultrasonic wave actuators and the first spring connects and draws the second tube-shaped member toward the first tube-shaped member, and when said ultrasonic wave actuators operate, the ball shaped substrate held on the first tube-shaped member rotates around a center of said ball shaped substrate.

12. The holder of claim 11, wherein the first and the second tube-shaped members are arranged to be held together by air pressure.

13. The holder of claim 11, wherein the insides of the first and the second tube-shaped members are connected to a means for reducing pressure.

14. The holder of claim 11, wherein the first end of the first tube-shaped member is attached to a shock absorbing material.

15. The holder of claim 11, wherein said holder comprises a means for monitoring a bottom of the ball shaped substrate from inside each of a plurality of tube-shaped members.

16. The holder of claim 15, wherein the actuation of the ultrasonic wave actuators is accomplished by a feedback control referring to an output of the means for monitoring.

17. The holder of claim 15, wherein said means for monitoring includes a charge-coupled device camera and an optics equipment which magnifies an image of said bottom of the ball shaped substrate.

18. The holder of claim 11, wherein the holder is mounted on an inside of the annular member and the ball shaped substrate on the holder is pushed to the holder by centrifugal force resulting from rotation of the annular member.

19. The holder of claim 11, wherein the holder comprises a third tube-shaped member, which supports the second tube-shaped member through at least three individually operable ultrasonic wave actuators.

* * * * *